US006268268B1

(12) United States Patent
Tokushige

(10) Patent No.: US 6,268,268 B1
(45) Date of Patent: Jul. 31, 2001

(54) METHOD OF MANUFACTURING SEMICONDUCTOR DEVICE

(75) Inventor: Nobuaki Tokushige, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/667,508

(22) Filed: Sep. 22, 2000

(30) Foreign Application Priority Data

Nov. 26, 1999 (JP) ................................................... 11-336071

(51) Int. Cl.$^7$ ..................................................... H01L 21/76

(52) U.S. Cl. ............................ 438/439; 438/443; 438/479

(58) Field of Search ..................................... 438/149, 152, 438/439, 443, 479

(56) References Cited

U.S. PATENT DOCUMENTS 6,096,583 * 8/2000 Iwamatsu et al. .................... 438/149

FOREIGN PATENT DOCUMENTS 9-298195 11/1997 (JP) .

* cited by examiner

Primary Examiner—Andrew Tran
Assistant Examiner—Bradley Smith
(74) Attorney, Agent, or Firm—Nixon & Vanderhye P.C

(57) ABSTRACT

A method of manufacturing a semiconductor device comprises the steps of: (a) forming a first oxide film and a first silicon nitride film on a surface semiconductor layer of an SOI substrate, the SOI substrate comprising the surface semiconductor layer formed on a support substrate with the intervention of a buried insulating film; (b) patterning the first silicon nitride film into a desired shape and performing a first LOCOS oxidization using the thus patterned first silicon nitride film as a mask to form a first LOCOS oxide film in a region for device isolation in the surface semiconductor layer; (c) selectively removing the first LOCOS oxide film, (d) forming sidewall spacers of a second silicon nitride film on sidewalls of the first silicon nitride film and the first oxide film; (e) performing a second LOCOS oxidization using the first silicon nitride film and the sidewall spacers as a mask to form a second LOCOS oxide film which is thinner than the first LOCOS oxide film; and (f) removing the first and second silicon nitride films.

10 Claims, 4 Drawing Sheets

US 6,268,268 B1

METHOD OF MANUFACTURING SEMICONDUCTOR DEVICE

CROSS-REFERENCE TO RELATED APPLICATION

This application is related to Japanese application No. HEI11(1999)-336071 filed on Nov. 26, 1999, whose priority is claimed under 35 USC § 119, the disclosure of which is incorporated by reference in its entirety.

BACKGROUND OF THE INVENTION

1. Field of the Invention

The present invention relates to a method of manufacturing a semiconductor device comprising an SOI (silicon on insulator or semiconductor on insulator) substrate in which a device isolation region is formed.

2. Description of Related Art

SOI substrates have conventionally been used for manufacturing semiconductor devices. On a surface silicon layer which comprises the SOI substrate, a device isolation film is formed to penetrate the surface silicon layer for isolation of the semiconductor devices.

For example, Japanese Unexamined Patent Publication No. HEI 9(1997)-298195 discloses a semiconductor device as shown in FIG. 4(g) utilizing the SOI substrate.

The semiconductor device comprises an SOI substrate 20 including a silicon substrate 21, a buried insulating film 22 and a surface silicon layer 23. Active regions for an N-channel transistor and a P-channel transistor are formed in the surface silicon layer 23 and electrically isolated from each other by a device isolation region. Source/drain regions for the N-channel transistor and the P-channel transistor are also formed in the active regions. Gate electrodes are formed on the surface silicon layer via a gate insulating film, and a silicon nitride film and an interlayer insulating film are formed to cover the gate insulating film, the gate electrode and the device isolation region. Through holes down to the source/drain regions are formed in the silicon nitride film and the interlayer insulating film so that connection with upper wirings can be provided.

Such a semiconductor device is manufactured in the following manner.

As shown in FIG. 3(a), a silicon nitride film 24 is formed on the surface silicon layer 23 on the SOI substrate 20, and then the silicon nitride film 24 is selectively removed from a region for device isolation. Using the silicon nitride film 24 as a mask, the surface silicon layer 23 is thermally oxidized to obtain a first LOCOS oxide film 25.

Then, as shown in FIG. 3(b), the first LOCOS oxide film 25 is selectively removed to form a groove 26 in the surface silicon layer 23.

Then, as shown in FIG. 3(c), a silicon nitride film 27 is selectively formed on the sidewalls of the groove 26 and the thermal oxidization is performed again. The surface silicon layer 23 at the bottom of the groove 26 is partially oxidized to form a second LOCOS oxide film, i.e., a device isolation region 28. The thermal oxidization completely oxidizes the surface silicon layer 23 at the bottom of the groove 26, so that the bottom of the device isolation region 28 contacts the top surface of the buried insulating film 22. The device isolation region 28 electrically divides the surface silicon layer 23 into two active regions. Thereafter, the silicon nitride film 24 used as the mask is selectively removed to form a gate insulating film 29 over the active regions.

Next, as shown in FIG. 3(e), a polycrystalline silicon film containing P-type or N-type impurities is formed on the gate insulating film 29 and patterned into gate electrodes 30. Then, as shown in FIG. 3(f), ion implantation to the active regions is carried out to form source/drain regions 31 in each of the active regions, and a silicon nitride film 32 is formed over the entire surface of the SOI substrate.

Then, as shown in FIG. 3(g), an interlayer insulating film 33 and through holes 34 are formed so that connection with upper wirings can be obtained.

As described above, the semiconductor device according to the prior art forms the active regions that are electrically isolated from each other by performing two LOCOS oxidization steps on the surface silicon layer 23.

The first LOCOS oxidization is performed to reduce the thickness of the surface silicon layer 23 at the bottom of the device isolation region 28 so that the height of silicon island regions surface made of the surface silicon layer 23 and that of the device isolation region 28 surface to be formed later can be adjusted to be flat. Further, through the first LOCOS oxidization, the edges of the silicon islands are formed in a round shape to prevent the generation of parasitic MOS.

The second LOCOS oxidization is carried out to form the silicon nitride film 27 on the sidewalls of the groove 26 as an oxidization resistive mask so as to prevent the formation of bird's beak. Further, the oxidization is intended to relax stress by performing it at high temperature (up to 1100° C.).

In the above manufacturing method of the semiconductor device, the purposes of the first and second LOCOS oxidization steps are described, but the thicknesses of the first and second LOCOS oxide films are not mentioned.

The relaxation of the stress and the thickness of the second LOCOS oxide film are significantly related. A thick second LOCOS oxide film will increase the stress applied around it, and eventually induce crystal defects in the surface silicon layer. This may cause leakage of the obtained transistors.

SUMMARY OF THE INVENTION

The present invention has been achieved to solve the above-mentioned drawbacks and intends to provide a method of manufacturing a semiconductor device in which the stress caused around the device isolation region is reduced and the yield of the dielectric strength of the source/drain regions of the transistor is improved.

The present invention provides with a method of manufacturing a semiconductor device comprising the steps of: (a) forming a first oxide film and a first silicon nitride film on a surface semiconductor layer of an SOI substrate, the SOI substrate comprising the surface semiconductor layer formed on a support substrate with the intervention of a buried insulating film; (b) patterning the first silicon nitride film into a desired shape and performing a first LOCOS oxidization using the thus patterned first silicon nitride film as a mask to form a first LOCOS oxide film in a region for device isolation in the surface semiconductor layer; (c) selectively removing the first LOCOS oxide film, (d) forming sidewall spacers of a second silicon nitride film on sidewalls of the first silicon nitride film and the first oxide film; (e) performing a second LOCOS oxidization using the first silicon nitride film and the sidewall spacers as a mask to form a second LOCOS oxide film which is thinner than the first LOCOS oxide film; and (f) removing the first and second silicon nitride films.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
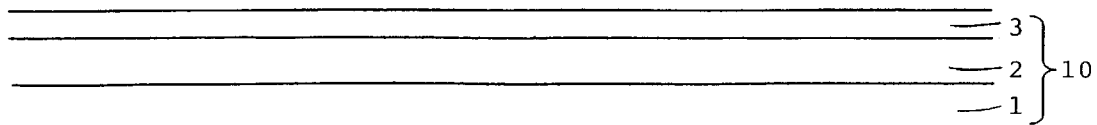
FIGS. 1(a) to 1(h) are schematic sectional views of a major part for illustrating an example of a manufacturing method of a semiconductor device according to the present invention.

According to the method of manufacturing the semiconductor device of the present invention, in the step (a), a first oxide film and a first silicon nitride film are formed on a surface semiconductor layer of an SOI substrate, the SOI substrate comprising the surface semiconductor layer formed on a support substrate with the intervention of a buried insulating film.

The SOI substrate may be used as a bonded SOI (BESOI) substrate, an SIMOX (Separation by Implantation of Oxygen) substrate and the like.

Various substrates can be used as the support substrate, for example, silicon substrates. Single crystal silicon substrates or polycrystalline silicon substrates are particularly preferable. Substrates of relatively low resistance (e.g., less than 20 Ωcm, preferably about 10 Ωcm) doped with N-type impurities such as phosphorus and arsenic or P-type impurities such as boron are preferable for the semiconductor substrate. Among them, the P-type substrate is more preferable. The crystal orientation thereof is preferably (100) plane.

The buried insulating film may be a $SiO_2$ film or a SiN film, among which the $SiO_2$ film is preferable. The thickness thereof may be about 50 to about 500 nm, or appropriately about 100 nm, though it can suitably be adjusted in view of a voltage to be applied to operate the obtained semiconductor device.

The surface semiconductor layer is a semiconductor thin film which serves as an active layer for forming the transistors, and can be made of a thin layer of silicon or the like. The silicon thin layer is preferably a single crystal layer. The thickness thereof may be, for example, about 40 to about 200 nm or preferably about 50 to about 100 nm, though it can suitably be adjusted in view of the structure of the semiconductor device to be obtained.

The first oxide film and the first silicon nitride film to be formed on the surface semiconductor layer are in general a pad oxide film and a non-oxidizable film, respectively, used for LOCOS oxidization method. The first oxide film may be a silicon oxide film, for example, and can be formed by thermal oxidation method, CVD method and the like. The thickness thereof may be about 10 to about 30 nm, for example. The first silicon nitride film can be formed by known techniques such as CVD method and the like to have a thickness of about 50 to about 150 nm, for example.

In the step (b), the first silicon nitride film is patterned into a predetermined shape.

The patterning needs to be performed so that the first silicon nitride film is opened in regions for device isolation, that is, the first silicon nitride film covers regions for forming active regions. The patterning can be carried out by known techniques such as photolithography and etching technique.

Using the thus obtained first silicon nitride film as a mask, the first LOCOS oxidization is performed. Accordingly, a first LOCOS oxide film is formed in the regions for device isolation. The first LOCOS oxidization in this step is preferably performed under such condition that enables to obtain the first LOCOS oxide film of a predetermined thickness.

In the step (c), the first LOCOS oxide film is selectively removed. This selective removal may be carried out by, for example, wet etching, dry etching and the like under the conditions of a high etching ratio of the first LOCOS oxide film to the silicon nitride film. More specifically, wet etching with a HF etchant is suitable.

In the step (d), a second silicon nitride film is formed on the sidewalls of the first silicon nitride film and the first oxide film to serve as sidewall spacers. That is, the sidewall spacers of the second silicon nitride film are formed on the sidewalls of the first silicon nitride film and the first oxide film that are exposed through the removal step of the first LOCOS oxide film. The method for forming the sidewall spacers is not particularly limited as long as the method is used for the formation of the sidewall spacers in a common formation process of the semiconductor device. For example, the second silicon nitride film is formed over the entire surface of the obtained SOI substrate and etched back into the sidewall spacers. The second silicon nitride film can be formed in the same manner as the formation of the first silicon nitride film. The etch back process of the second silicon nitride film can be carried out by RIE, for example. The thickness of the second silicon nitride film is about 10 to about 50 nm, for example.

The second silicon nitride film may be formed directly on the surface semiconductor layer of the SOI substrate, preferably, a second oxide film is formed in advance on the surface semiconductor layer exposed through the removal step of the first LOCOS oxide film and then the second nitride film is formed on the SOI substrate. In this case, the second oxide film may be formed by known techniques without any particular limitation, but thermal oxidation is preferable since the second oxide film can be selectively formed only on the exposed surface semiconductor layer. The thickness of the second oxide film is about 5 to about 20 nm, for example.

In the step (e), the second LOCOS oxidization is carried out using the first silicon nitride film and the sidewall spacers as a mask to form a second LOCOS oxide film in the regions for device isolation. The second LOCOS oxidization needs to be performed so that the second LOCOS oxide film is formed to have a predetermined thickness, that is, to be thinner than the first LOCOS oxide film. More specifically, it is preferred to set the ratio of the thickness of the second LOCOS oxide film to that of the first LOCOS oxide film as approximately 0.6 to 0.8, though it varies depending on the thickness of the surface semiconductor layer. When the transistors are formed utilizing the SOI substrate obtained within the range, the yield of dielectric strength between the source/drain regions of 96% or more can be ensured. More preferably, the ratio is about 0.6 to 0.7. Accordingly, the yield of dielectric strength of as high as 98% or more can be ensured, which leads to the reduction of the production costs. The second LOCOS oxidization fully oxidizes the surface semiconductor layer in the direction of the entire thickness thereof. That is, the second LOCOS oxide film preferably penetrates the surface semiconductor layer so that the bottom thereof reaches the buried insulating film.

In the step (f), the first and second silicon nitride films are removed. This removal may be carried out by wet etching, dry etching or the like under the conditions of a high etching ratio to the silicon oxide film.

Through the above-mentioned steps, the device isolation region can be formed in the surface semiconductor layer of the SOI substrate.

In the present invention, it is preferred to carry out the formation of wells in the semiconductor substrate or in the surface semiconductor layer, the formation of well contacts, the impurity implantation to the surface semiconductor layer, the formation of MOS transistors, the formation of the interlayer insulating film, the formation of the contact holes to the interlayer insulating film, the formation of the wirings and the thermal treatments before, during or after the above-mentioned steps. Thus, transistors mainly of full depletion type can be formed on the SOI substrate.

Hereinafter, the semiconductor device and an example of the method of manufacturing the same according to the present invention will be described with reference to the drawings. However, the present invention is not limited thereto.

As shown in FIG. 1(a), an SOI substrate used in this example comprises a p-type single crystal silicon film 3 of about 50 nm thick having a resistance of about 20 Ωcm and the crystal orientation of (100) plane formed on a support substrate 1 with the intervention of a silicon thermal oxide film 2 of about 110 nm thick.

Figure 1B:
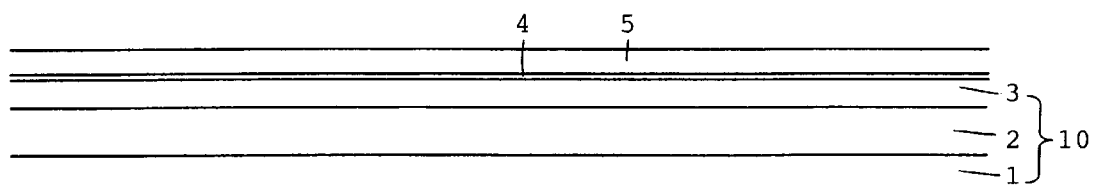

As shown in FIG. 1(b), a first pad oxide film 4 (about 10 nm thick) and a silicon nitride film 5 (about 20 nm thick) are formed on the single crystal silicon film 3 of the SOI substrate 10.

Figure 1C:
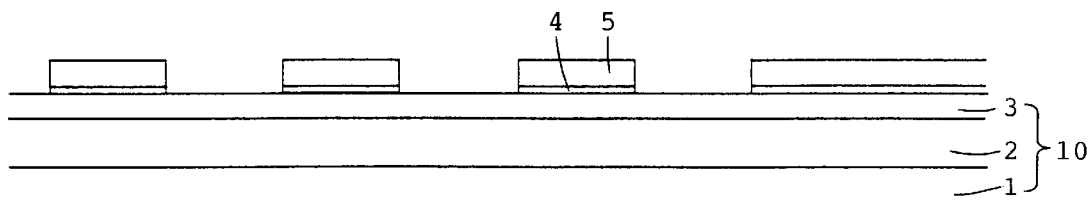

Then, as shown in FIG. 1(c), the first pad oxide film 4 and the silicon nitride film 5 in a region other than that for active regions are removed by a known technique.

Figure 1D:
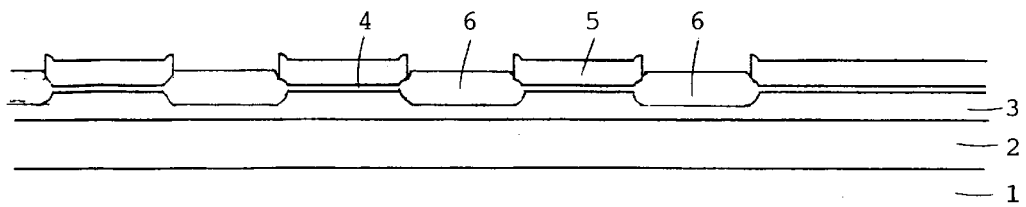

Then, as shown in FIG. 1(d), the first LOCOS oxidization is carried out to form a first LOCOS oxide film 6 of about 65 nm thick.

Figure 1E:
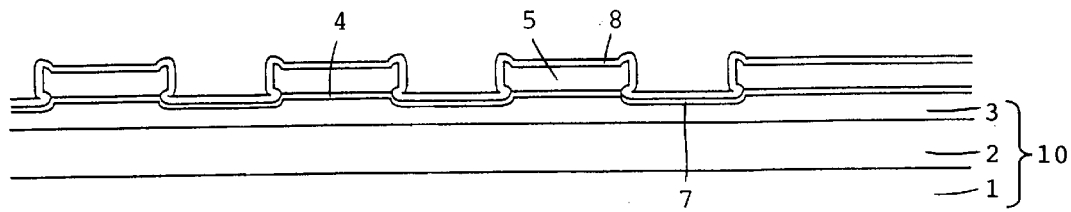

Next, as shown in FIG. 1(e), the first LOCOS oxide film 6 is removed, a second pad oxide film 7 (about 10 nm thick) is formed on the single crystal silicon film 3, and a silicon nitride film 8 (about 20 nm thick) is formed over the entire surface of the SOI substrate 10.

Figure 1F:
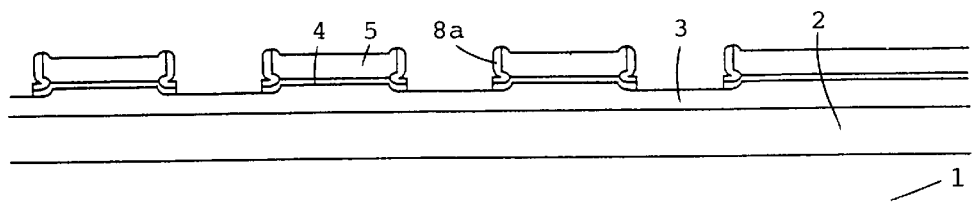

Thereafter, as shown in FIG. 1(f), the silicon nitride film 8 is etched back to form spacers 8a on the sidewalls of the silicon nitride film 5.

Figure 1G:
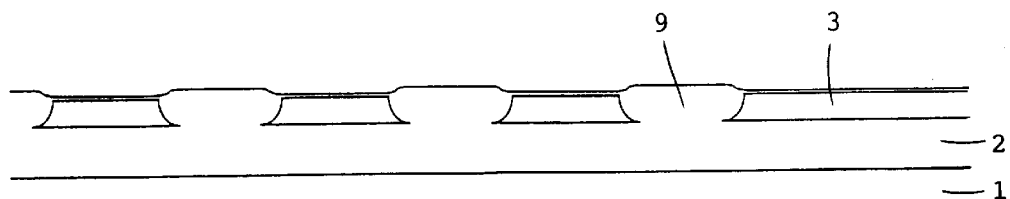

The SOI substrate 10 is subjected to the second LOCOS oxidization to form a second LOCOS oxide film 9 of about 50 to about 60 nm thick. Then, the silicon nitride film 5 and the spacers 8a are removed as shown in FIG. 1(g).

Figure 1H:
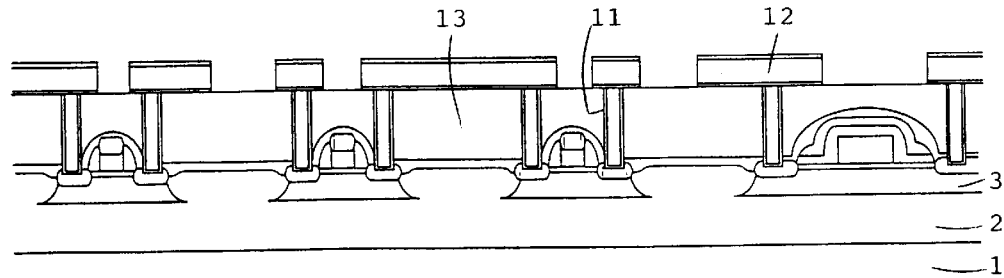

Subsequently, transistors are formed on the active regions by a salicide technique and an interlayer insulating film 13, contact holes 11 and wirings 12 are formed as shown in FIG. 1(h).

Figure 2:
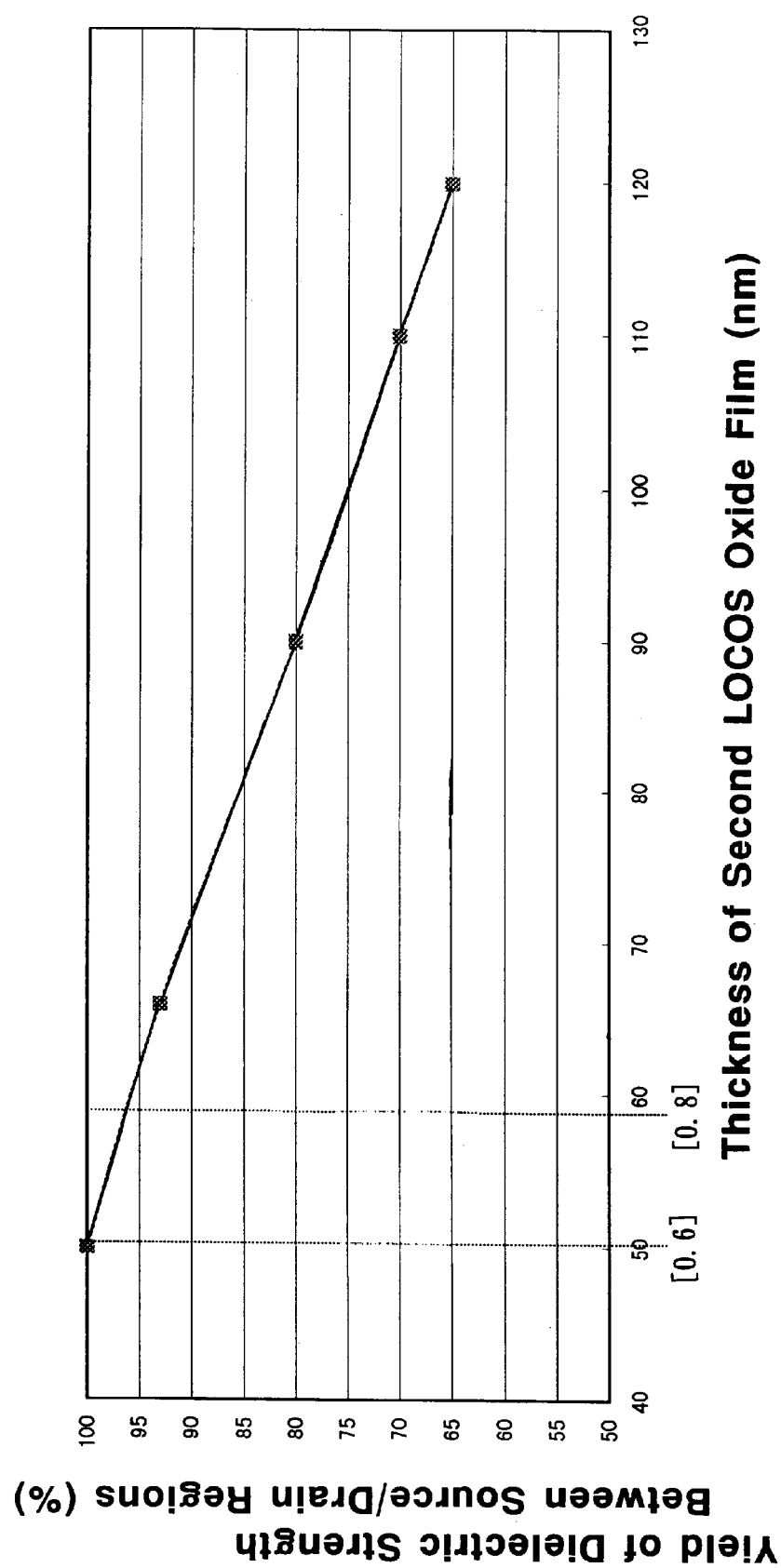
FIG. 2 is a graph illustrating the relationship of the yield of the dielectric strength between the source/drain regions and the thickness of the second LOCOS oxide film.
Figure 3A:
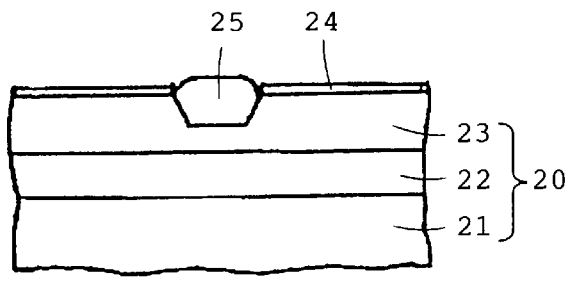
FIGS. 3(a) to 3(g) are schematic sectional views of a major part for illustrating a manufacturing method of a semiconductor device according to the prior art.
Figure 3B:
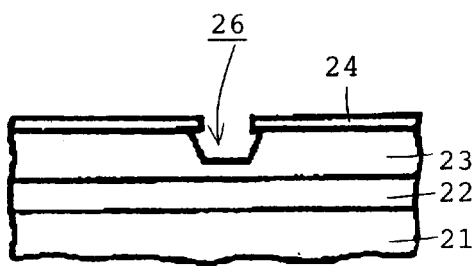
Figure 3C:
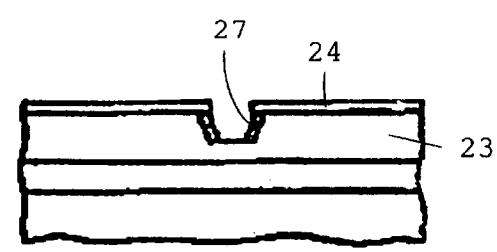
Figure 3D:
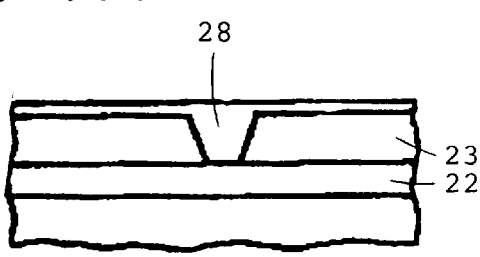
Figure 3E:
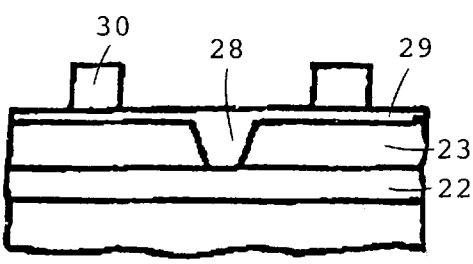
Figure 3F:
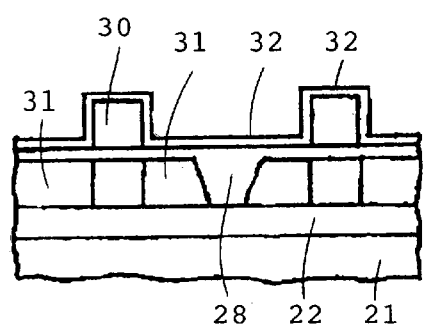
Figure 3G:
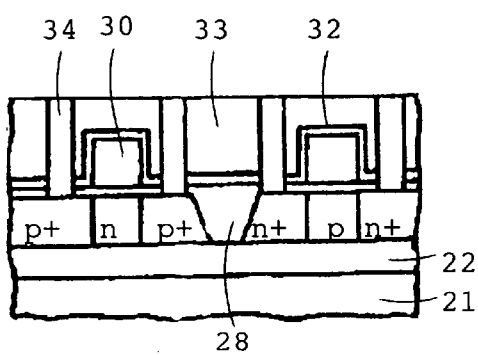

FIG. 2 shows the relationship between the thickness of the second LOCOS oxide film and the yield of the dielectric strength between the source/drain regions for a hundred thousand transistors connected in parallel (NMOS) obtained in the same manner as the manufacturing method of the present invention. Used SOI substrate includes a surface silicon layer of about 50 nm thick, a gate electrode is sized into L/W=0.35/5 μm and the total thickness of the both LOCOS oxide films is 130 nm.

Referring to FIG. 2, when the thickness of the second LOCOS oxide film is 50 nm, the first LOCOS oxide film is 80 nm thick and the yield of the dielectric strength between the source/drain regions is 100%. Further, when the second LOCOS oxide film is 57 nm thick, the first LOCOS oxide film is 73 nm thick and the yield of the dielectric strength between the source/drain regions is 97%. From the results, the yield of the dielectric strength between the source/drain regions can be improved by forming the first LOCOS oxide film thicker than the second LOCOS oxide film. Therefore, to achieve more than 96% yield, it is necessary to set the ratio of the thickness of the second LOCOS oxide film to that of the first LOCOS oxide film as about 0.6 or more to about 0.8 or less. When the second LOCOS oxidization is excessive, the stress in the single crystal silicon film increases. Further, when the ion implantation of the impurities into the single crystal silicon film and a thermal treatment are performed in a later step to form the source/drain regions, the thermal treatment will cause oxidization enhanced diffusion of the impurities along the crystal defects generated immediately below the gates. Accordingly, a narrow diffusion layer (leakage path) is generated between the source/drain regions in the lower area of the channel, reducing the dielectric strength.

As described above, making the thickness of the first LOCOS oxide film greater than that of the second LOCOS oxide film reduces the stress applied around the LOCOS oxide films. Further, the thick first LOCOS oxide film restricts the by-generation of interstitial Si caused by the second LOCOS oxidization. That is, the stress caused by the first LOCOS oxide film to the single crystal silicon film is released by the crystal defects generated through the formation of the second pad oxide film or the thermal treatment for the second LOCOS oxidization. Further, excessive second LOCOS oxidization can be prevented.

According to the present invention, without any additional production steps, the device isolation region can be formed in the SOI substrate while reducing the stress caused around the device isolation region, without affecting the basic properties of the SOI substrate. Further, the present invention provides a method of manufacturing the semiconductor device, which can improve the yield of the dielectric strength between the source/drain regions in transistors formed with the SOI substrate including the thus formed device isolation regions, as well as the yield of the transistors themselves.

What is claimed is:

1. A method of manufacturing a semiconductor device comprising:
   (a) forming a first oxide film and then a first silicon nitride film on a surface semiconductor layer of an SOI substrate, the SOI substrate comprising the surface semiconductor layer formed on a support substrate with the intervention of a buried insulating film;
   (b) patterning the first silicon nitride film into a desired shape and performing a first LOCOS oxidization using the thus patterned first silicon nitride film as a mask to form a first LOCOS oxide film in a region for device isolation in the surface semiconductor layer;
   (c) selectively removing the first LOCOS oxide film,
   (d) forming sidewall spacers of a second silicon nitride film on sidewalls of the first silicon nitride film and the first oxide film;

(e) performing a second LOCOS oxidization using the first silicon nitride film and the sidewall spacers as a mask to form a second LOCOS oxide film which is thinner than the first LOCOS oxide film; and (f) removing the first and second silicon nitride films.

2. A method according to claim 1, wherein the ratio of the thickness of the second LOCOS oxide film to that of the first LOCOS oxide film is 0.6 to 0.8.

3. A method according to claim 2, wherein the ratio of the thickness of the second LOCOS oxide film to that of the first LOCOS oxide film is 0.6 to 0.7.

4. A method according to claim 1, wherein the second LOCOS oxide film is formed so that the bottom thereof reaches the buried insulating film in the step (e).

5. A method according to claim 1, wherein the first LOCOS oxide film is removed by wet etching under the conditions of a high etching ratio of the first LOCOS oxide film to the silicon nitride film in the step (c).

6. A method according to claim 1, wherein the first and second silicon nitride films are removed by wet etching under the conditions of a high etching ratio to the silicon oxide film in the step (f).

7. A method of manufacturing a semiconductor device, the method comprising:

forming a first oxide film and then a first silicon nitride film on a surface semiconductor layer of an SOI substrate, the SOI substrate including the surface semiconductor layer formed on a support substrate with a buried insulating film provided therebetween;

patterning the first silicon nitride film into a desired shape and performing a first LOCOS oxidation using the patterned first silicon nitride film as a mask in order to form a first LOCOS oxide film in a region for device isolation;

removing at least a portion of the first LOCOS oxide film;

forming sidewall spacers on sidewalls of the first silicon nitride film and the first oxide film;

performing a second LOCOS oxidation using the first silicon nitride film and the sidewall spacers as a mask in order to form a second LOCOS oxide film, wherein the second LOCOS oxide film has a thickness less than a thickness of the first LOCOS oxide film; and removing the first silicon nitride film and sidewall spacers.

8. The method of claim 7, wherein the sidewall spacers comprise silicon nitride.

9. The method of claim 7, wherein a ratio of the thickness of the second LOCOS oxide film to the thickness of the first LOCOS oxide film is from 0.6 to 0.8.

10. The method of claim 7, wherein the first silicon nitride film and the sidewall spacers are removed by wet etching.

* * * * *